(12) United States Patent  (10) Patent No.: US 8,017,488 B2
Liu et al.  (45) Date of Patent: Sep. 13, 2011

(54) MANUFACTURING METHOD OF A NOR FLASH MEMORY WITH PHOSPHOROUS AND ARSENIC ION IMPLANTATIONS

(75) Inventors: Sheng-Da Liu, Chu-Pei (TW); Yider Wu, Chu-Pei (TW)

(73) Assignee: EON Silicon Solutions Inc., Chu-Pei ( * ) Notice: Subject to any disclaimer, the term of this patent is extended or adjusted under 35 U.S.C. 154(b) by 127 days.

(21) Appl. No.: 12/562,870

(22) Filed: Sep. 18, 2009

(65) Prior Publication Data
US 2011/0070705 A1 Mar. 24, 2011

(51) Int. Cl.
*H01L 21/336* (2006.01)
(52) U.S. Cl. ........ 438/305; 438/301; 438/303; 438/306; 438/419; 438/420; 438/545; 438/547; 438/914
(58) Field of Classification Search .................. 438/299, 438/301, 303, 305, 306, 418, 419, 420, 433, 438/542, 545, 546, 547, 914, FOR. 154, FOR. 161
See application file for complete search history.

(56) References Cited

U.S. PATENT DOCUMENTS

| | | | |
|---|---|---|---|
| 2002/0045320 A1* | 4/2002 | Choi et al. | 438/303 |
| 2002/0102793 A1* | 8/2002 | Wu | 438/257 |
| 2003/0128584 A1* | 7/2003 | Shiromoto et al. | 365/185.05 |
| 2010/0171161 A1* | 7/2010 | Wu et al. | 257/314 |
| 2010/0230738 A1* | 9/2010 | Wu et al. | 257/314 |

* cited by examiner

*Primary Examiner* — N Drew Richards
*Assistant Examiner* — Joannie A Garcia
(74) *Attorney, Agent, or Firm* — Schmeiser, Olsen & Watts LLP

(57) ABSTRACT

A manufacturing method of a NOR flash memory with phosphorous and arsenic ion implantations mainly implants both phosphorous and arsenic ions on a drain area of a transistor memory unit, and controls specific energy and dosage for the implantation to reduce the defects of a memory device and improve the yield rate of the NOR flash memory.

5 Claims, 4 Drawing Sheets

MANUFACTURING METHOD OF A NOR FLASH MEMORY WITH PHOSPHOROUS AND ARSENIC ION IMPLANTATIONS

FIELD OF THE INVENTION

The present invention relates to a manufacturing method of a NOR flash memory, in particular to a manufacturing method of a NOR flash memory with phosphorous and arsenic ion implantations.

BACKGROUND OF THE INVENTION

Flash memory is a non-volatile memory capable of maintaining the contents of information even without an external power supply, and thus the flash memory can achieve a data storage without the need of consuming electric power, and the flash memory also has the advantages of a repeated write and read function, a small size, a high capacity, and a convenient portability, so that the flash memory is particularly suitable to be applied to portable devices. In addition to its current application provided for computer motherboards to store BIOS data, NOR flash memory is also used extensively in mobile phones and other handheld devices for storing system data, and its high access speed can satisfy the booting requirement of the handheld devices.

As the development of semiconductor process advances rapidly, the capacity of memory increases constantly, the semiconductor process becomes increasingly more difficult, and the limitations of physical phenomena also become more significantly. Thus, manufacturers and designers spare no effort to find a procedure or a method to improve the yield rate of memories.

Since a drain junction is one of the major factors of producing a defect of a NOR flash memory device, therefore a metallization process is generally performed to enhance the performance of the memory device. In other words, a self-aligned silicidation deposits a metal silicide layer onto a drain area to reduce the contact resistance and allow current to pass through the metal silicide layer having a lower resistance first and then enter into the drain area. The metal silicide layer must come with a specific depth in the drain junction in order to reduce the contact resistance, and thus a loss at the drain junction will be produced when the metal silicide layer is formed, and the loss will increase a current leak of the drain junction.

Since the ion implantation of a source/drain area relates to the electric properties of the memory device directly, therefore the design of the memory device tends to be optimized, and it is necessary to control the best condition for the energy and dosage of the ion implantation to lower the defective rate and improve the yield rate of the memory device.

SUMMARY OF THE INVENTION

Therefore, it is a primary objective of the present invention to provide a manufacturing method of a NOR flash memory, and the method uses specific energy and dosage for an ion implantation to reduce the defect produced by a metallization process and improve the yield rate of a memory device.

To achieve the foregoing objective, the present invention provides a manufacturing method of a NOR flash memory with phosphorous and arsenic ion implantations. The method comprises the step of: forming a gate structure on a semiconductor substrate; performing a heavily doped source ion implantation process to form a heavily doped first source area in the semiconductor substrate on a side of the gate structure; performing a lightly doped drain ion implantation process to form a lightly doped first drain area in the semiconductor substrate on another side of the gate structure, wherein the first drain area and the first source area are situated in the semiconductor substrates on different sides of the gate structure respectively; forming an insulation layer spacer on the semiconductor substrates disposed on both sides of the gate structure respectively; and performing a heavily doped drain ion implantation process to form a heavily doped second drain area in the semiconductor substrate on a side of the gate structure, wherein the first drain area is superimposed onto the second drain area, and the heavily doped drain ion implantation process includes two times of implantation processes, and the first-time heavily doped drain ion implantation process adopts arsenic ions, and the second-time heavily doped drain ion implantation process adopts phosphorous ions.

In a first preferred embodiment of the present invention, the first-time heavily doped drain ion implantation process adopts a dosage of approximately $2\times10^{15}$~$4\times10^{15}$ atom/cm$^2$ and energy of approximately 40~50 Kev.

In a first preferred embodiment of the present invention, the second-time heavily doped drain ion implantation process adopts a dosage of approximately $2\times10^{14}$~$2\times10^{15}$ atom/cm$^2$ and energy of approximately 20~30 Kev.

In a first preferred embodiment of the present invention, the insulation layer spacer is made of silicon oxide (SiO$_x$), silicon nitride (SiN$_x$), silicon oxide nitride (SiON$_x$) or a combination of silicon oxide and silicon nitride.

In a first preferred embodiment of the present invention, the method further includes a metallization process comprising the steps of: forming a self-aligned silicon oxide layer on surfaces of the gate structure and the first drain area; depositing a dielectric layer and defining a self-aligned contact opening of the dielectric layer formed on the self-aligned silicon oxide layer above the first drain area; and filling up a conducting material into the self-aligned contact opening to form a metal interconnect.

In another preferred embodiment of the present invention, the second-time heavily doped drain ion implantation process is carried out before the first-time heavily doped drain ion implantation process.

Therefore, the manufacturing method of a NOR flash memory with phosphorous and arsenic ion implantations in accordance with the present invention can change the feature and performance of the drain implantation to reduce the defects produced in the metallization process and enhance the yield rate of the memory device.

DESCRIPTION OF THE PREFERRED EMBODIMENTS

Other features and advantages of the present invention will become apparent in the following detailed description of the preferred embodiments with reference to the accompanying drawings. Same numerals are used in the figures and preferred embodiments to illustrate same elements.

With reference to FIGS. 1 to 6 for cross-sectional views of different manufacturing steps of a NOR flash memory in accordance with a preferred embodiment of the present invention, the manufacturing method of the NOR flash memory mainly implants both phosphorus and arsenic ions into a drain area of a memory device, and adopts specific energy and dosage to control and reduce the defects of the memory device and enhance the yield rate. In a preferred embodiment of the present invention, an N-type NOR semiconductor memory structure includes N-type source and drain ion implantation areas.

Figure 1:
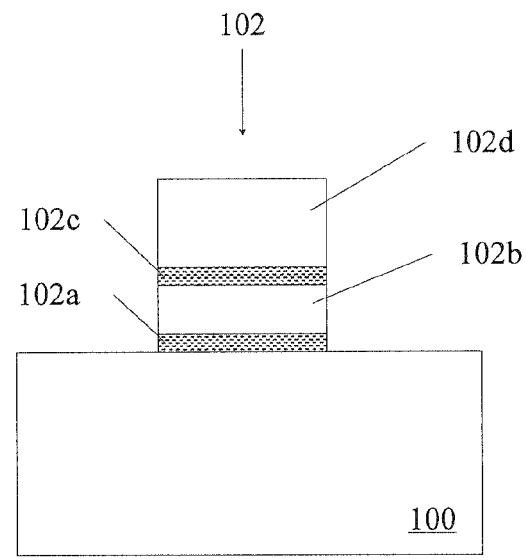
FIGS. 1 to 6 are cross-sectional views of different manufacturing steps of a NOR flash memory in accordance with a preferred embodiment of the present invention respectively.

With reference to FIG. 1, a gate structure 102 is formed on a semiconductor substrate 100, and the gate structure 102 comprises a tunnel oxide layer 102a, a floating gate 102b, a dielectric layer 102c and a control gate 102d. The semiconductor substrate 100 is made of silicon (Si), silicon-germanium (SiGe), silicon on insulator (SOI), silicon germanium on insulator (SGOI), or germanium on insulator (GOI). In this preferred embodiment, the semiconductor substrate 100 is made of silicon and doped with boron to produce a P-type semiconductor substrate from the semiconductor substrate 100.

Figure 2:
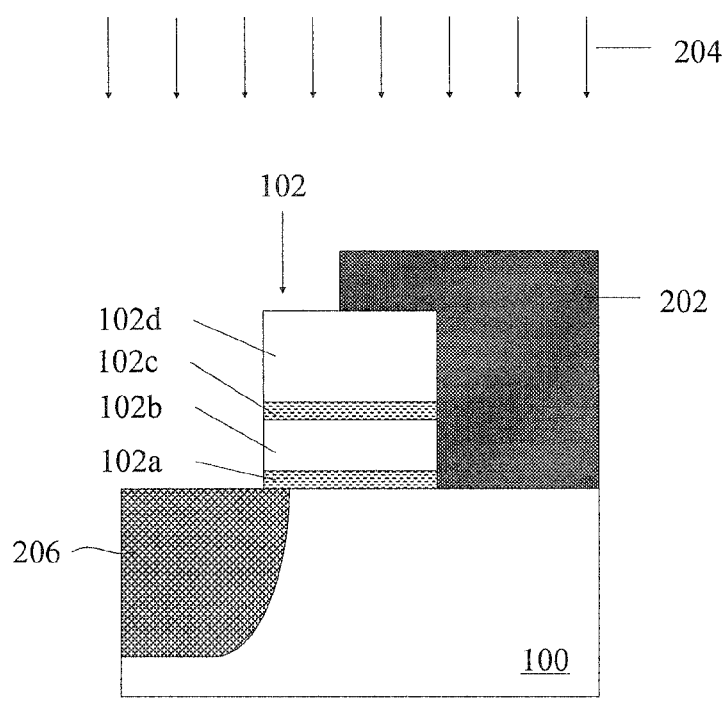

With reference to FIG. 2, a mask 202 is formed on the semiconductor substrate 100 and covered onto a side of the gate structure 102. A heavily doped source ion implantation process 204 is performed to form a heavily doped first source area 206 in the semiconductor substrate 100 on a side of the gate structure 102. In this preferred embodiment, a P-type substrate is used, and both phosphorous and arsenic ions are used in the heavily doped source ion implantation process 204 to reduce a parasitic resistance of the first source area.

Figure 3:
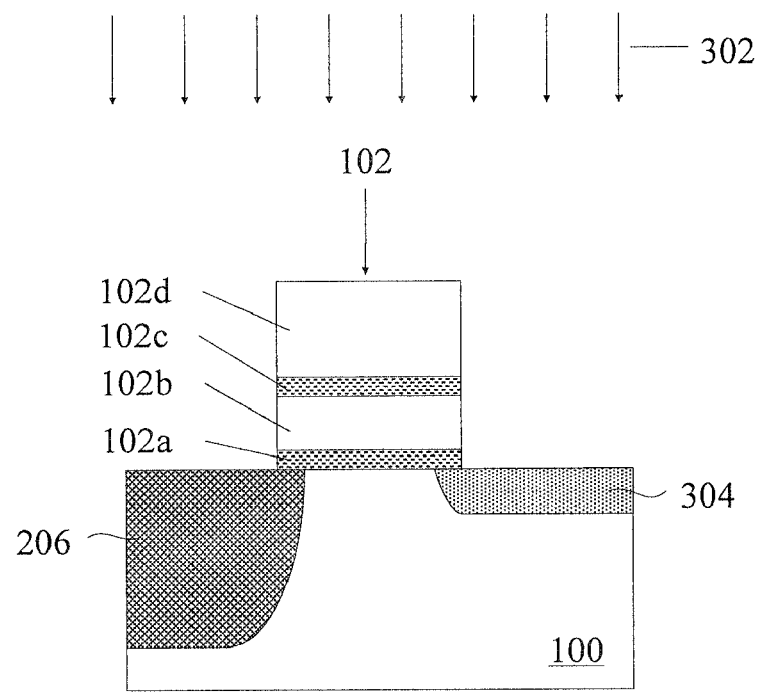

With reference to FIG. 3, a lightly doped drain ion implantation process 302 is performed to form a first drain area 304 in the semiconductor substrate 100 on another side of the gate structure 102 by using a lightly doped drain (LDD) implantation. The first source area 206 and the first drain area 304 are situated in the semiconductor substrates 100 on different sides of the gate structure respectively. In this preferred embodiment, the lightly doped drain ion implantation process adopts arsenic ions to reduce a short channel effect, improve the performance, and enhance the efficiency of accessing the memory.

Figure 4A:
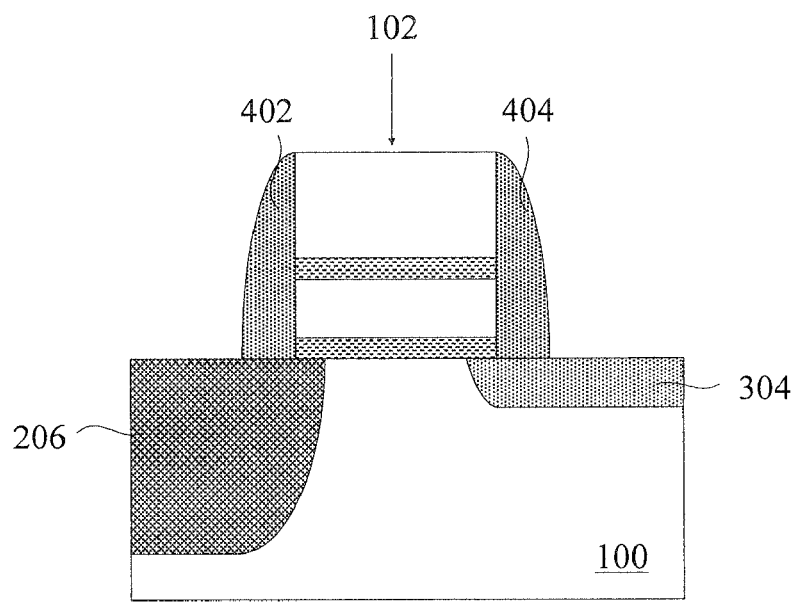
Figure 4B:
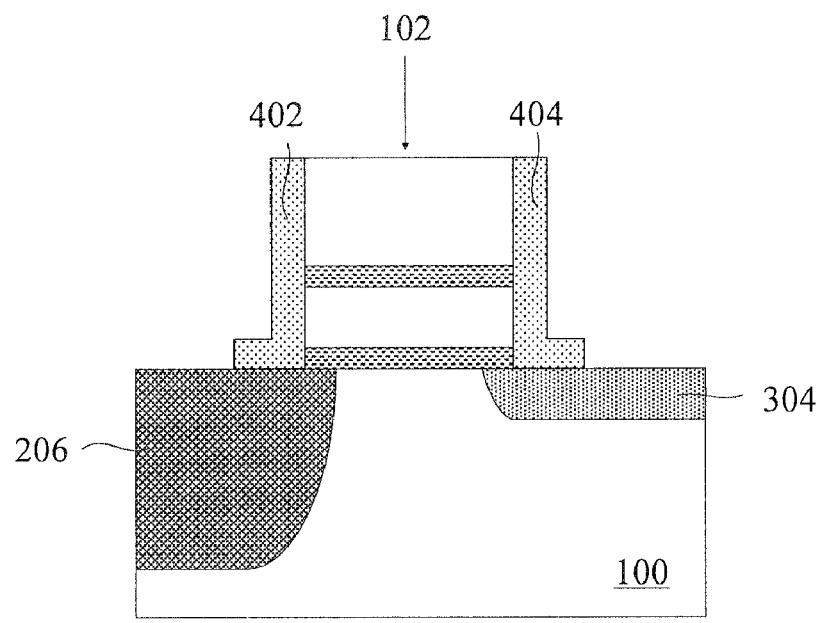
Figure 4C:
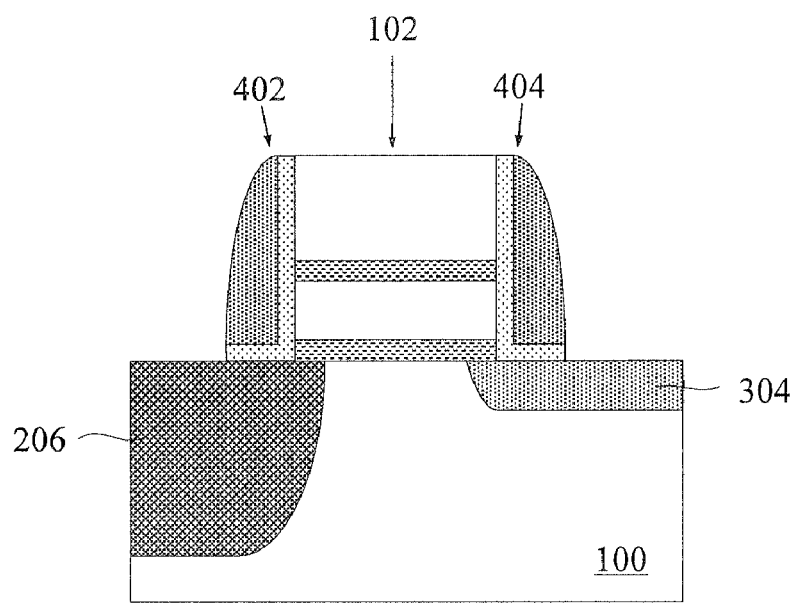

With reference to FIG. 4A, an insulation layer spacer 402, 404 is formed individually on both sides of the gate structure 102 by a deposition or etching technology. The insulation layer spacer 402, 404 can be made of silicon oxide ($SiO_x$), silicon nitrate ($SiN_x$), silicon oxide nitride ($SiON_x$) or a combination of silicon oxide and silicon nitrate ($SiO_x+SiN_x$). In FIG. 4A, the insulation layer spacer is made of silicon oxide ($SiO_x$) or silicon oxide nitride ($SiON_x$); in FIG. 4B, the insulation layer spacer is made of silicon nitrate ($SiN_x$); and in FIG. 4C, the insulation layer spacer is made of a combination of silicon oxide and silicon nitrate ($SiO_x+SiN_x$). The silicon oxide shown in the figure indicates a sector insulation layer spacer, and the silicon nitrate shown in the figure is an L-shaped insulation layer spacer. A manufacturing procedure of a memory device in accordance with a preferred embodiment of the invention is illustrated in FIG. 4A. The aforementioned deposition technology can be a chemical vapor deposition (CVD), a rapid thermal chemical vapor deposition (RTCVD), or an atomic layer deposition (ALD) using $NH_3$ and $SiH_4$ as source gases, and the etching technology can be an anisotropic dry or wet etching for removing the insulation layer on a vertical surface to form the insulation layer spacer 402, 404.

Figure 5:
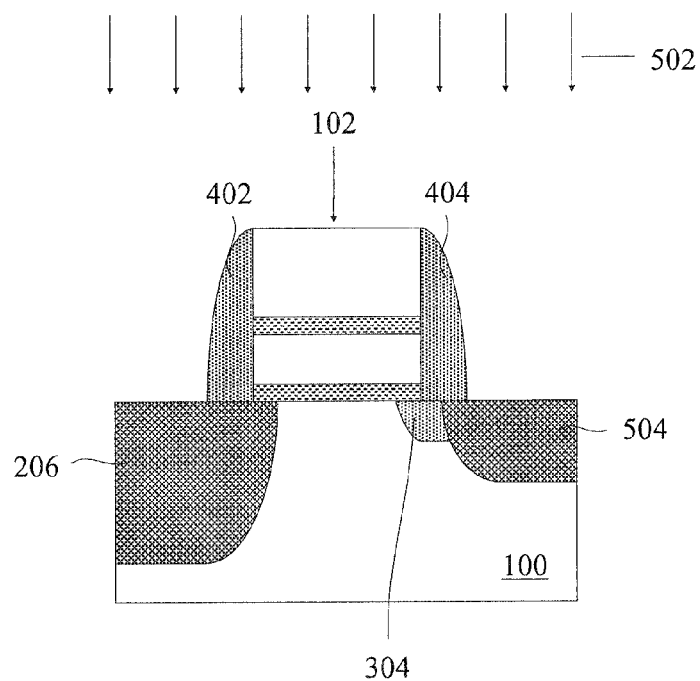

With reference to FIG. 5, a heavily doped drain ion implantation process 502 is performed to form a heavily doped second drain area 504 in the semiconductor substrate 100 on a side of the gate structure 102, wherein the heavily doped drain ion implantation process includes two times of implantation processes, and the first-time heavily doped drain ion implantation process adopts arsenic ions with a dosage of approximately $2\times10^{15}$~$4\times10^{15}$ atom/$cm^2$ and energy of approximately 40~50 Kev, and the second-time heavily doped drain ion implantation process adopts phosphorous ions with a dosage of approximately $2\times10^{14}$~$2\times10^{15}$ atom/$cm^2$ and energy of approximately 20~30 Kev. In another preferred embodiment of the present invention, the sequence of performing the first-time and second-time heavily doped drain ion implantation processes is reversed.

Figure 6:
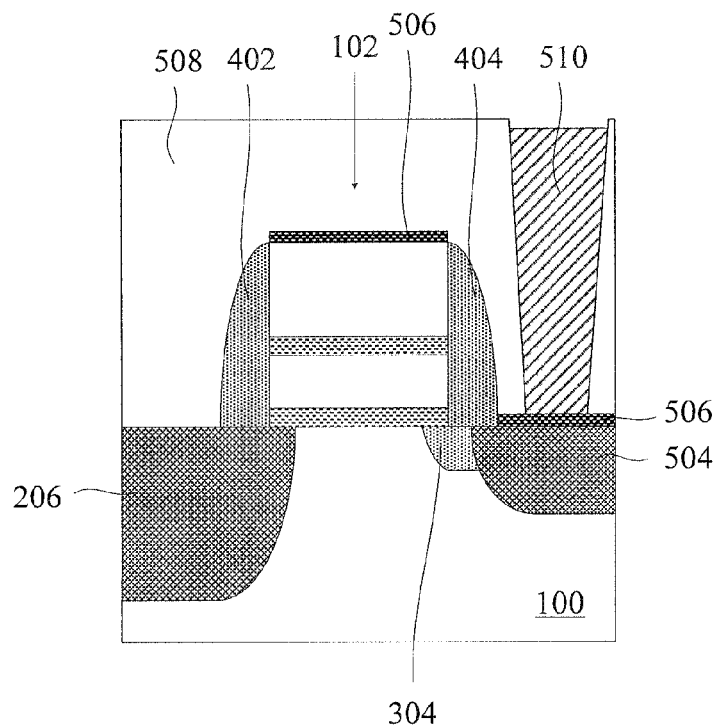

With reference to FIG. 6 for the continuation of the aforementioned procedure, a metallization process is perform to form a self-aligned silicon oxide layer 506 on the second drain area 504 and the gate structure 102 individually, and then a dielectric layer 508 is deposited and a self-aligned contact opening is defined at the dielectric layer 508 and formed on the self-aligned silicon oxide layer 506 above the first drain area 304, and a conducting material is filled into the self-aligned contact opening to form a metal interconnect 510. In this preferred embodiment, the self-aligned silicon oxide layer 506 is made of a thermal resisting metal such as cobalt (Co), titanium (Ti), nickel (Ni) or molybdenum (Mo).

While the invention has been described by means of specific embodiments, numerous modifications and variations could be made thereto by those skilled in the art without departing from the scope and spirit of the invention set forth in the claims.

What is claimed is:

1. A manufacturing method of a NOR flash memory with phosphorous and arsenic ion implantations, comprising the steps of:
    forming a gate structure on a semiconductor substrate;
    performing a heavily doped source ion implantation process to form a heavily doped first source area in the semiconductor substrate on a side of the gate structure;
    performing a lightly doped drain ion implantation process to form a lightly doped first drain area in the semiconductor substrate on another side of the gate structure, and the first drain area and the first source area being disposed in the semiconductor substrate on different sides of the gate structure respectively;
    forming an insulation layer spacer individually on the semiconductor substrate on both sides of the gate structure; and
    performing a heavily doped drain ion implantation process to form a heavily doped second drain area in the semiconductor substrate on a side of the gate structure, wherein the first drain area is superimposed onto the second drain area, and the heavily doped drain ion implantation process includes two times of implantation process, and a first-time heavily doped drain ion implantation process uses arsenic ions, and a second-time heavily doped drain ion implantation process uses phosphorous ions,
    wherein the second-time heavily doped drain ion implantation process is performed before the first-time heavily doped drain ion implantation process.

2. The manufacturing method of claim 1, wherein the first-time heavily doped drain ion implantation process uses a dosage of approximately $2\times10^{15}$ to $4\times10^{15}$ atom/$cm^2$ and an energy of approximately 40 to 50 Kev.

3. The manufacturing method of claim 1, wherein the second-time heavily doped drain ion implantation process uses a dosage of approximately $2\times10^{14}$ to $2\times10^{15}$ atom/$cm^2$ and an energy of approximately 20 to 30 Kev.

4. The manufacturing method of claim 1, wherein the insulation layer spacer is made of a substance selected from the collection of silicon oxide ($SiO_x$), silicon nitrate ($SiN_x$), silicon oxide nitride ($SiON_x$) and a combination of silicon oxide and silicon nitrate.

5. The manufacturing method of claim 1, further comprising a metallization process with the steps of:
   forming a self-aligned silicon oxide layer on a surface of the gate structure and the first drain area;
   depositing a dielectric layer, and defining the dielectric layer on the self-aligned silicon oxide layer at the top of the first drain area to form a self-aligned contact opening; and
   filling up a conducting material into the self-aligned contact opening to form a metal interconnect.

* * * * *